(12) United States Patent
Bando et al.

(10) Patent No.: US 6,429,705 B1
(45) Date of Patent: Aug. 6, 2002

(54) RESETTING CIRCUIT INDEPENDENT OF A TRANSISTOR'S THRESHOLD

(75) Inventors: Yoshihide Bando; Toshiya Uchida, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/820,714

(22) Filed: Mar. 30, 2001

(30) Foreign Application Priority Data

Oct. 18, 2000 (JP) ........................................ 2000-317748

(51) Int. Cl.[7] .......................... H03K 17/687; H03K 17/22
(52) U.S. Cl. .......................................... 327/143; 327/198
(58) Field of Search ................................. 327/142, 143, 327/198, 545

(56) References Cited

U.S. PATENT DOCUMENTS

| | | | | |
|---|---|---|---|---|
| 4,446,381 A | * | 5/1984 | Dalrymple | 327/143 |
| 4,634,905 A | * | 1/1987 | Campbell, Jr. | 327/143 |
| 5,115,146 A | * | 5/1992 | McClure | 327/143 |
| 5,144,159 A | * | 9/1992 | Frisch et al. | 327/143 |
| 5,359,233 A | * | 10/1994 | Mumper et al. | 327/143 |
| 5,530,395 A | * | 6/1996 | Ting | 327/543 |
| 6,346,834 B1 | * | 2/2002 | Chai | 327/143 |

\* cited by examiner

Primary Examiner—Timothy P. Callahan
Assistant Examiner—Terry L. Englund
(74) Attorney, Agent, or Firm—Arent Fox Kintner Plotkin & Kahn, PLLC

(57) ABSTRACT

A resetting circuit includes first and second transistors that respectively receive first and second voltages through gates. The ratio W/L of the second transistor is larger than that of the first transistor. The first and second voltages rise in accordance with the rise of a supply voltage. The second voltage is lower than the first voltage. Since an increase in the current IDS of the first transistor is greater than an increase in the current IDS of the second transistor, an inversion occurs between the current IDSs of the first and second transistors by applying a predetermined supply voltage. Since a reset signal is generated when the values of the currents IDS of the first and second transistors cross, the reset signal can always be generated by the predetermined supply voltage, independent from the threshold voltage of the transistor.

7 Claims, 10 Drawing Sheets

RESETTING CIRCUIT INDEPENDENT OF A TRANSISTOR'S THRESHOLD

BACKGROUND OF THE INVENTION

1. Field of the Invention

The present invention relates to a semiconductor device having a resetting circuit.

2. Description of the Related Art

Generally, a semiconductor device, such as a DRAM, includes a resetting circuit. When the power supply is turned on, the resetting circuit is operated to initialize an internal circuit, so that the semiconductor device is prevented from malfunctioning.

FIG. 1 shows an example of the resetting circuit implemented in the semiconductor device.

The resetting circuit has an nMOS transistor 2, a voltage generating circuit 4, a load circuit 6, and a waveform shaping circuit 8. The nMOS transistor connects a gate electrode to a node ND01, connects a drain electrode to a node ND02, and connects a source electrode to a ground line VSS. The voltage generating circuit 4 is formed such that resistors R1 and R2 are connected in series with each other with the node ND01 between a power supply line VCC and the ground line VSS. The load circuit 6 is formed such that an end of the load circuit 6 is connected to the power supply line VCC, and the other end of the load circuit 6 is connected to a resistor R3 connected to the node ND02. The waveform shaping circuit 8 has two inverters that are connected in series. In the waveform shaping circuit 8, its input is connected to the node ND02, and a reset signal RST is output from its output.

This type of resetting circuit detects that a supply voltage VCC has risen to a predetermined value by utilizing the threshold voltage of a transistor (in this example, the nMOS transistor 2), and inactivates the reset signal RST.

FIG. 2 shows the operation of the resetting circuit mentioned above. When an external supply voltage VCC starts to be supplied to the semiconductor device, the level of the reset signal RST rises in accordance with the external supply voltage VCC for a predetermined period of time, and then becomes low (inactivated). After the supply voltage VCC reaches a predetermined value, the internal circuit that needs to be initialized in the semiconductor device is initialized during a period T1 during which the reset signal RST is inactivated. When the reset signal RST is inactivated, the reset operation is completed, so that the internal circuit begins to perform a normal operation.

Recently, the operating voltage of semiconductor devices has become low, and, accordingly, a supply voltage VCC supplied from external sources has become low. The ratio of the threshold voltage of a transistor to the supply voltage VCC is high since the threshold voltage of the transistor has almost no dependence on the supply voltage VCC. As a result, the detection level of the supply voltage VCC of the resetting circuit greatly varies depending on a change in the threshold voltage, and the amount (T2 in FIG. 2) of deviation in the inactivation timing of the reset signal RST with respect to a change in the threshold voltage becomes larger than that in the case where the operating voltage is high. The threshold voltage of the transistor varies with the manufacturing conditions, the position of a chip on a wafer, and the position of the wafer in a production lot, of the semiconductor device, or depends on the temperature when the semiconductor device is operating.

For example, a reset period T1 is shortened if the inactivation timing of the reset signal RST deviates to an early-timing side. This case raises a fear that the internal circuit will not be normally initialized. In the worst case, a high-level period of the reset signal RST necessary to initialize the internal circuit will disappear. On the other hand, if the inactivation timing of the reset signal RST deviates to a late-timing side, there is a fear that the reset signal RST will not be inactivated (i.e., be always at a high level).

There is a case in which, for example, the aforementioned voltage generating circuit 4 is formed of many resistors and fuses, in order to deal with the deviation of the threshold voltage of the transistor at the time a semiconductor device is manufactured. In this case, some of the resistors to be connected in series are selected by trimming the fuses, and a voltage generated in the node ND01 is adjusted according to a threshold voltage. However, the thus constructed voltage generating circuit has a disadvantage in that the chip size increases because a large layout area is required for the resistors and the fuses. Additionally, manufacturing costs increase because a step to trim the fuses is required.

SUMMARY OF THE INVENTION

An object of the present invention is to generate a reset signal which is not influenced by a change in the threshold voltage of a transistor. In other words, the object is to reduce fluctuations in the inactivation timings of reset signals generated by a resetting circuit.

Another object of the present invention is to reliably initialize an internal circuit of a semiconductor device by the reset signal, and thereby prevent malfunctioning of the semiconductor device.

According to one of the aspects of the present invention, the resetting circuit includes a first transistor that receives a first voltage at a gate electrode and a second transistor that receives a second voltage at the gate electrode. The second transistor is formed such that the ratio W/L (transistor size) of a gate width W to a channel length L is larger than the ratio W/L of the first transistor. The first voltage rises in accordance with the rise of a supply voltage. The second voltage rises in accordance with the rise of the supply voltage, and is lower than the first voltage.

The gate voltage (accurately, gate-to-source voltage) of the second transistor is always lower than the gate voltage of the first transistor. The transistor size of the second transistor is larger than that of the first transistor. Therefore, the drain-to-source current (i.e., subthreshold current) of the second transistor is larger than the drain-to-source current of the first transistor for a while after the supply voltage is applied (i.e., while the supply voltage is low).

Since the first voltage is always higher than the second voltage, an increase in the drain-to-source current of the first transistor is larger than an increase in the drain-to-source current of the second transistor. In other words, an inversion layer is formed in the first transistor earlier than in the second transistor. As a result, the drain-to-source current of the first transistor is equalized with the drain-to-source current of the second transistor at a predetermined supply voltage, and thereafter the drain-to-source current of the first transistor becomes larger than that of the second transistor. That is, an inversion occurs between the drain-to-source currents of the first and second transistors by the predetermined supply voltage.

If the threshold voltages of the first and second transistors are both high, both the drain-to-source currents thereof become large. Therefore, the supply voltage in which the electric current is inverted is substantially the same as when the threshold voltage is at its average level. The same applies to the case in which the threshold voltages of the first and second transistors are both low. That is, the supply voltage in which the electric current is inverted is substantially the same as when the threshold voltage is at its average level. Since the control circuit generates the reset signal when the values of the drain-to-source currents cross, the reset signal can always be generated at the predetermined supply voltage, independent from the threshold voltage of the transistor.

Therefore, in the case when the resetting circuit is formed in a semiconductor device, an internal circuit of the semiconductor device is initialized whenever the supply voltage reaches a predetermined value, without being influenced by a change in the threshold voltage. the reset signal may be generated by, for example, the direct detection of a current value, and may be generated by utilizing a voltage generated in the drain electrode of the transistor.

According to another aspect of the resetting circuit in the present invention, since the channel lengths L of the first and second transistors are equalized with each other, the two transistors maintain predetermined relative relations with each parameter in subthreshold characteristic during changes in each of the parameters. This results in a desired V-l characteristic to be easily realized.

According to still another aspect of the resetting circuit in the present invention, the resetting circuit includes a load circuit. The load circuit is connected to the drain electrode of the first transistor and to the drain electrode of the second transistor, and supplies an electric current to the first transistor and the second transistor. The reset signal is generated in accordance with a change in voltages of at least one of the drain electrode of the first transistor and the drain electrode of the second transistor. That is, the reset signal can easily be generated by generating a voltage based on the drain-to-source currents of the first and second transistors by the load circuit. A predetermined circuit can reliably be initialized by the reset signal generated in response to a change in the voltage.

According to still another aspect of the resetting circuit in the present invention, the resetting circuit includes an earth circuit. The earth circuit is connected to the source electrode of the first transistor and to the source electrode of the second transistor, and adjusts an electric current running through the first and second transistors. Therefore, the reset signal can be generated with minimum electric current consumed by the resetting circuit.

According to still another aspect of the resetting circuit in the present invention, the first voltage and the second voltage are reliably generated by a voltage generating circuit.

BRIEF DESCRIPTION OF THE DRAWINGS

The nature, principle, and utility of the invention will become more apparent form the following detailed description when read in conjunction with the accompanying drawings in which like parts are designated by identical reference numbers, in which.

DESCRIPTION OF THE PREFERRED EMBODIMENTS

Embodiments of the present invention will be described hereinafter with reference to the attached drawings.

Figure 1:
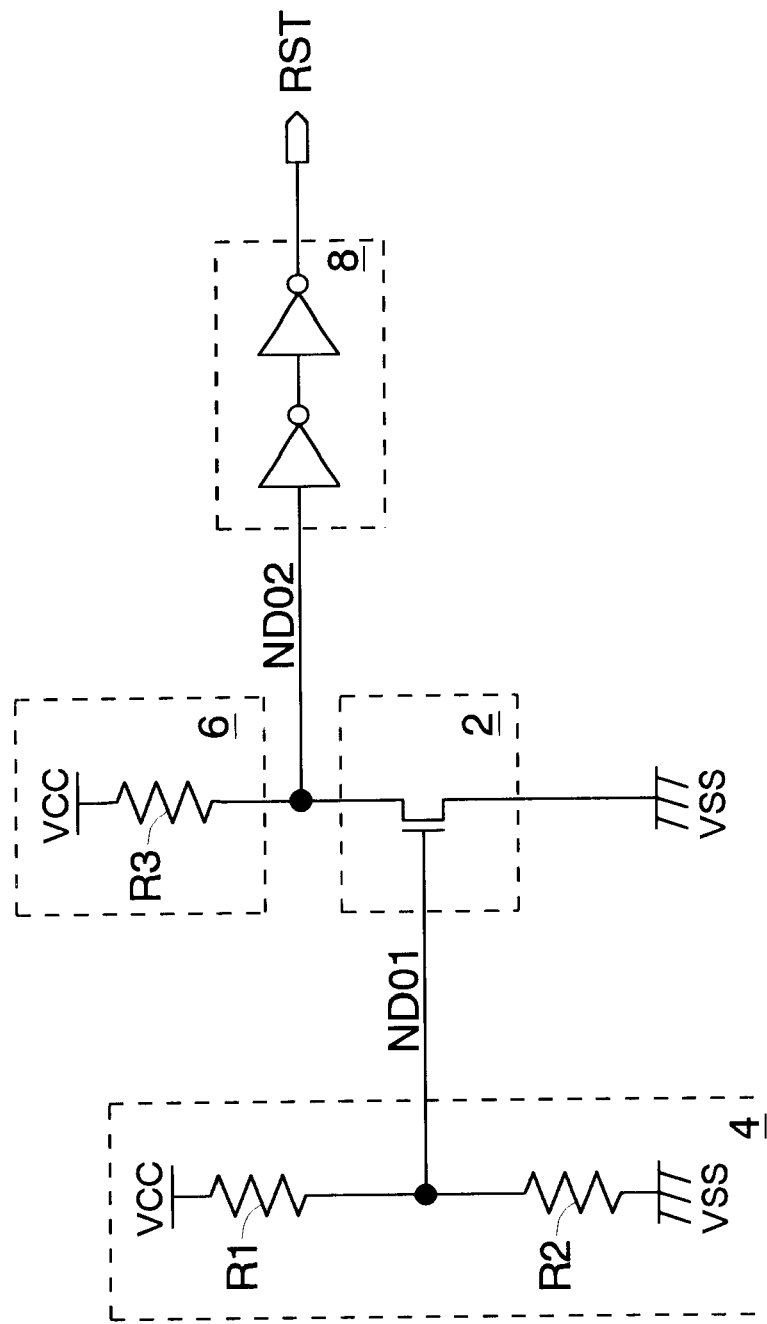
FIG. 1 is a circuit diagram showing an example of a conventional resetting circuit.
Figure 2:
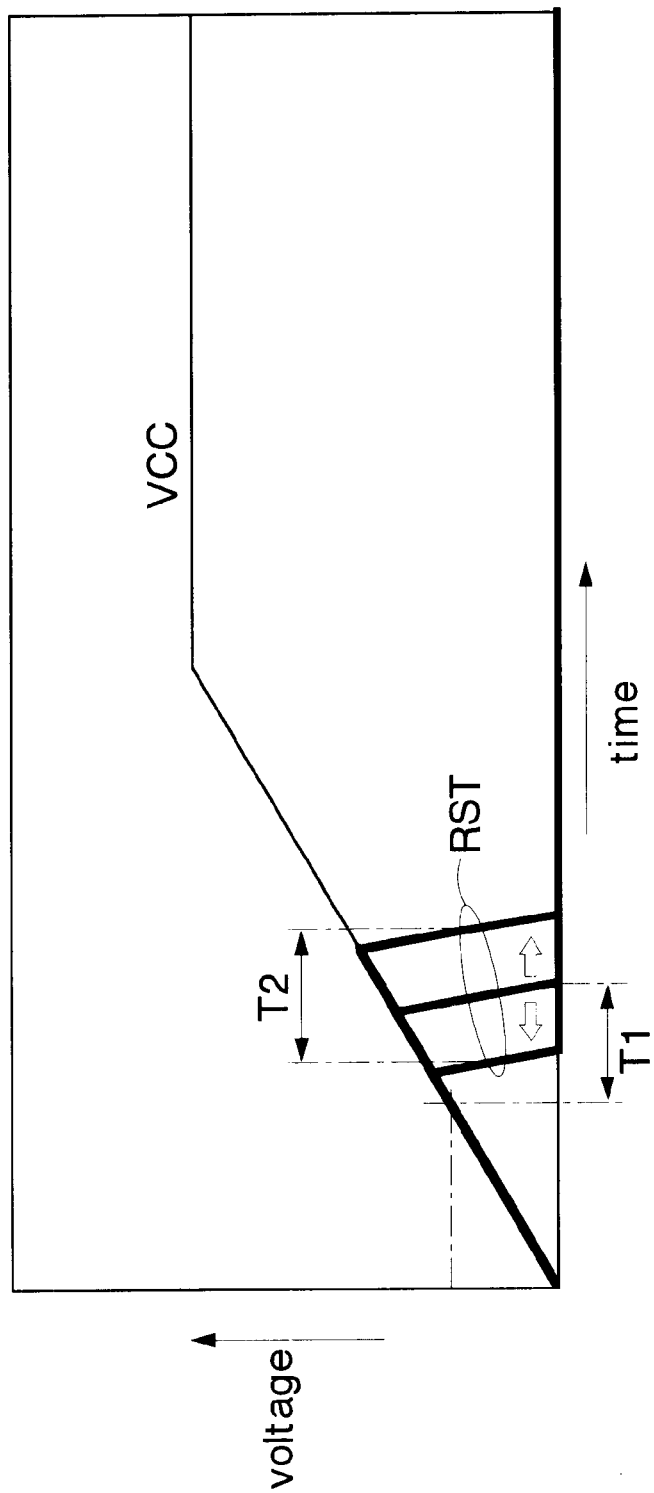
FIG. 2 is an explanatory drawing showing the operation of the conventional resetting circuit.
Figure 3:
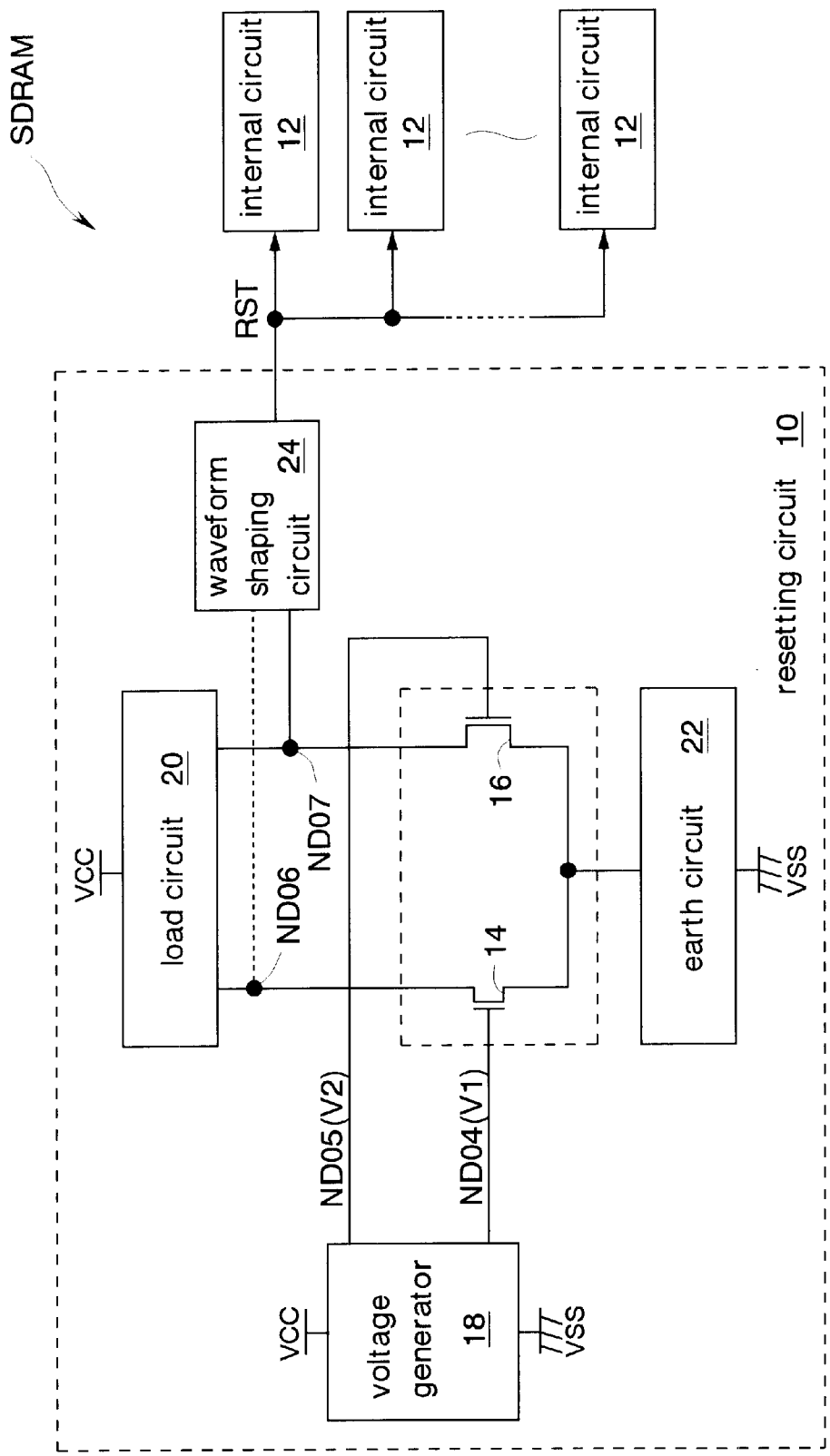
FIG. 3 is a block diagram showing the basic principle of the present invention.

FIG. 3 shows the basic principle of a resetting circuit and a semiconductor device having the resetting circuit of the present invention.

The semiconductor device is formed as, for example, a SDRAM (Synchronous DRAM) on a silicon substrate by using a CMOS process.

The SDRAM includes a resetting circuit 10 and internal circuits 12 initialized by a reset signal RST generated by the resetting circuit 10. The resetting circuit 10 includes a first transistor 14 and a second transistor 16 of nMOS transistors, a voltage generating circuit 18, a load circuit 20, an earth circuit 22, and a waveform shaping circuit 24. The voltage generating circuit 18, the load circuit 20, the earth circuit 22, and the waveform shaping circuit 24 are a control circuit for generating the reset signal. The SDRAM further includes an I/O circuit, a memory core, and a control circuit for controlling the memory core in addition to those shown in the figure.

The ratio W/L of a gate width W to a channel length L of the second transistor 16 is designed to be greater than the ratio W/L of a gate width W to a channel length L of the first transistor 14. In the figure, the size of the second transistor 16 is shown to be larger than that of the first transistor 14. In the first and second transistors 14 and 16, their. source electrodes are connected to each other. The source electrodes are connected to the earth 15 circuit 22. The gate of the first transistor 14 is connected to the voltage generating circuit 18 through a node ND04. The gate of the second transistor 16 is connected to the voltage generating circuit 18 through a node ND05. The drain electrodes of the first and second transistors 14 and 16 are connected to the load circuit 20 through nodes ND06 and ND07, respectively. At least one of the drain electrodes of the first and second transistors 14 and 16 is connected to the waveform shaping circuit 24.

The waveform shaping circuit 24 outputs a reset signal RST. When a power supply is on, the reset signal RST is activated (i.e., at a high level) for a predetermined period of time, and thereafter is inactivated, for example.

A power supply line VCC and a ground line VSS are connected to the voltage generating circuit 18. In the following description, a voltage supplied to the power supply line VCC is designated as a supply voltage VCC, and a voltage supplied to the ground line VSS is designated as a ground voltage VSS. The voltage generating circuit 18 generates a first voltage V1 in the node ND04 in accordance with a rise in the supply voltage VCC, and generates a second voltage V2 lower than the first voltage V1 in the node ND05. That is, the first transistor 14 receives the first voltage V1, which is raised in accordance with a rise in the supply voltage VCC, through the gate electrode, and the second transistor 16 receives the second voltage V2 (lower than the first voltage V1), which is raised in accordance with a rise in the supply voltage VCC, through the gate electrode.

The load circuit 20 connected to the power supply line VCC supplies an electric current to the first and second transistors 14, 16, and causes the drain electrodes of the first and second transistors 14, 16 to generate a voltage. The earth circuit 22 adjusts an electric current running through the first and second transistors 14, 16. Therefore, a reset signal RST can be generated in a state in which the current consumed in the resetting circuit 10 is minimized. If the load circuit 20 can adjust the current running through the first and second transistors 14, 16, the earth circuit 22 is unnecessary.

The waveform shaping circuit 24 shapes a voltage waveform generated in the drain electrodes of the first and second transistors 14, 16, and outputs it as a reset signal RST.

Figure 4:
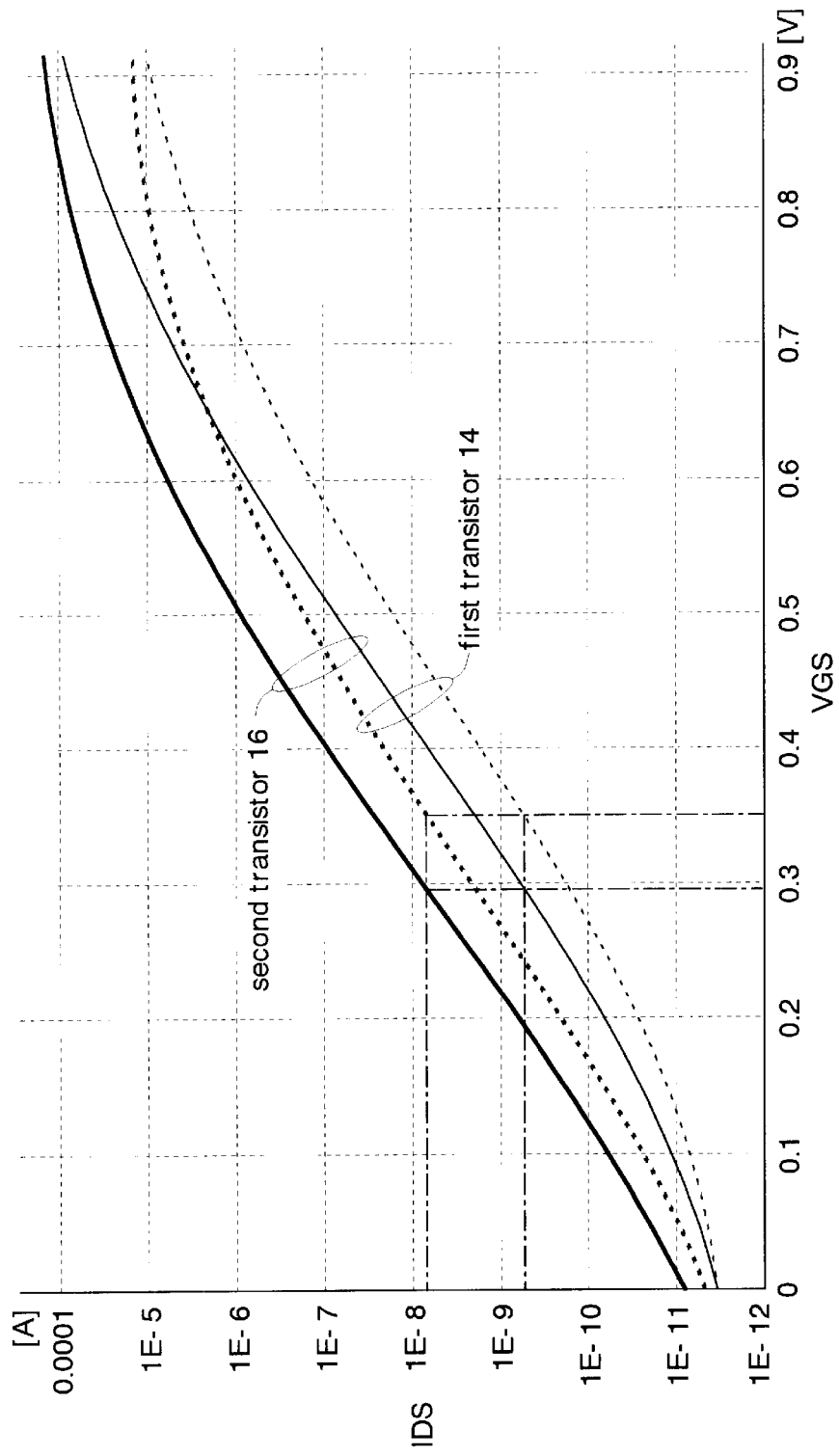
FIG. 4 is an l-V characteristic diagram of an nMOS transistor.

FIG. 4 shows how a drain-to-source current IDS varies in relation to the gate-to-source voltages VGS of the first and second transistors 14 and 16 in a subthreshold area. The characteristic of the first transistor 14 is shown by the solid line, and the characteristic of the second transistor 16 is shown by the broken line. In other words, the first and second transistors 14, 16 are formed to obtain the characteristics shown in FIG. 4. The IDS characteristic is calculated according to the following equation:

$$IDS=(W/L) \times \beta \times (VGS-Vth)^2$$

where IDS is a drain-to-source current, W and L are a gate width of the transistor and a gate length thereof, respectively, β is a constant proper to the transistor, VGS is a gate-to-source voltage, and Vth is a threshold voltage of the transistor.

Referring to the solid and broken lines, the upper solid and broken lines in the figure each indicate a case where the threshold voltage of the transistor is lowest in specifications, and the lower ones each indicate a case where the threshold voltage of the transistor is highest therein. The resetting circuit 10 shown in FIG. 3 keeps the reset signal RST at a high level (i.e., a resetting period) until the supply voltage VCC reaches, for example, 1.2V, and changes the reset signal RST to a low level when the supply voltage VCC exceeds 1.2V, as described later.

In this example, the reset signal RST changes to the low level when the voltages of the nodes ND04 and ND0S (i.e., gate voltages of the first and second transistors 14, 16) reach about 0.35V and 0.3V, respectively. In the vicinity of these voltages, the first and second transistors 14, 16 are almost the same in the rate of change in the current to a change in the voltage. Therefore, in these voltages, the drain-to-source current IDS of each of the first and second transistors 14, 16 become equal independently of the threshold voltage.

Figure 5:
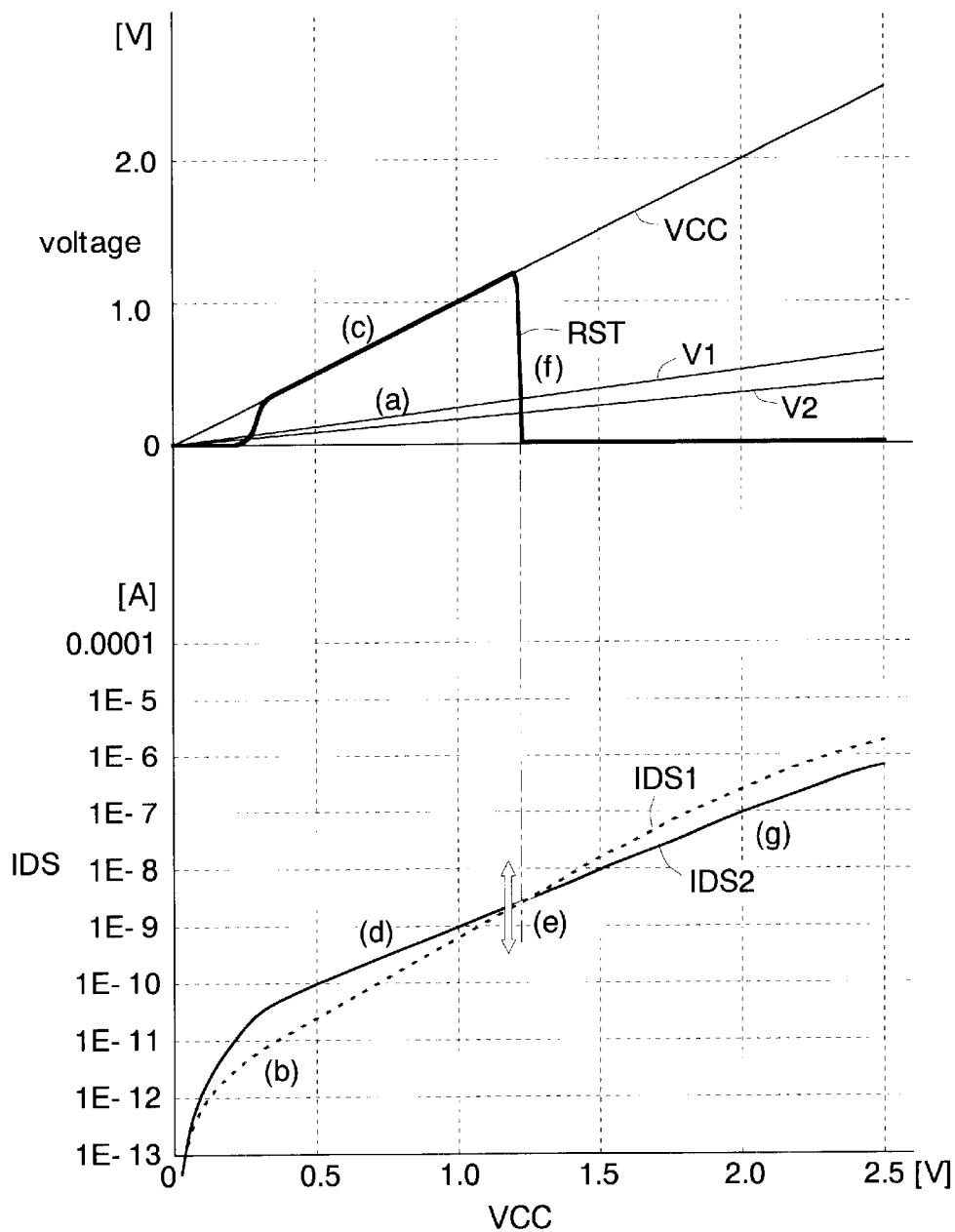
FIG. 5 is a characteristic diagram showing the operation of a resetting circuit of FIG. 3.

FIG. 5 shows the operation of the resetting circuit 10 described above. The upper part of the figure shows the respective changes of the first voltage V1, the second voltage V2, and the reset signal RST in relation to the supply voltage VCC. The lower part thereof shows the respective changes of the drain-to-source currents IDS of the first and second transistors 14, 16 in relation to the supply voltage VCC.

When the power supply of the system mounted with a SDRAM is turned on, and the supply voltage VCC rises, the first and second voltages V1, V2 rise in accordance with the supply voltage VCC (FIG. 5(a)). The first voltage V1 is always higher than the second voltage V2. In the subthreshold area of the transistor, the current IDS2 of the second transistor 16, the ratio W/L of which is large, is larger than the current IDS1 of the first transistor 14 (FIG. 5(b)).

The voltage of the node ND06 shown in FIG. 3 is higher than that of the node ND07 at this time, and the reset signal RST is at a high level (FIG. 5(c)). The internal circuit of the SDRAM is initialized at the point where the supply voltage VCC rises and exceeds a predetermined value, in response to the activation of the reset signal RST.

Since the first voltage V1 is always higher than the second voltage V2, an increase in the electric current IDS1 of the first transistor 14 becomes larger than an increase in the electric current IDS2 of the second transistor 16 (FIG. 5 (d)). In other words, the inversion layer of a channel in the first transistor 14 is formed earlier than that of a channel in the second transistor 16.

Thereafter, the respective currents IDS1 and IDS2 of the first and second transistors 14, 16 increase, and both the currents IDS1 and IDS2 are equalized with each other (FIG. 5(e)). The voltage of the node ND06 is equal to that of the node ND07 at this time. Corresponding to the fact that the currents IDS1 and IDS2 of the first and second transistors 14, 16 have been equalized with each other, the reset signal RST changes to a low level (FIG. 5(f)). That is, the present invention generates the reset signal RST by the use of the characteristic of the subthreshold area of the transistor and the characteristic obtained when the inversion layer is formed.

Thereafter, the current IDS1 of the first transistor 14 becomes larger than the current IDS2 of the second transistor 16 (FIG. 5 (g)). Accordingly, the voltage of the node ND06 becomes lower than that of the node ND07.

The internal circuit of the SDRAM shown in FIG. 3 releases the initialized state and reaches a normally operable state, in response to the inactivation (low-level) of the reset signal RST.

According to the manufacturing conditions of the SDRAM, the threshold voltages of the first and second transistors 14, 16 both change to the same side. As shown in FIG. 4, the currents IDS of the first and second transistors 14, 16 are the same even when the threshold voltage changes within the range of a voltage VGS of 0.3V to 0.35V. Accordingly, as indicated by the arrow of FIG. 5, the intersection of the currents IDS1 and IDS2 of the transistors 14, 16 changes only in the directions of the currents (i.e., vertically in the figure) even when the threshold voltage changes. As a result, the reset., signal RST is always inactivated by a predetermined supply voltage VCC,(in this example, about 1.2V) even when the threshold voltages of the first and second transistors 14, 16 change.

As described above, in this embodiment, the two nMOS transistors 14, 16 are formed in the resetting circuit 10, and the gate electrode of the large size nMOS transistor 16 is always supplied with a voltage lower than the gate electrode of the small size nMOS transistor 14 when the supply voltage rises. Since the reset signal RST is generated when the values of the drain-to-source currents IDS of the first and second transistors 14, 16 cross, the reset signal RST can be always generated by a predetermined supply voltage VCC independently of the threshold voltages of the transistors 14, 16.

Since this resetting circuit 10 is formed in the SDRAM, the internal circuit 12 of the SDRAM can be always initialized by the predetermined supply voltage.

Since a voltage is generated by the load circuit 20 in the drain electrodes of the first and second transistors 14, 16, a reset signal RST can be easily generated corresponding to a change in at least one voltage of the drain electrodes of the first and second transistors 14, 16.

Since the earth circuit 22 is connected to the source electrodes of the first and second transistors 14, 16, the electric current running through the first and second transistors 14, 16 can be adjusted. Therefore, a reset signal RST can be generated while minimizing the electric current consumed by the resetting circuit 10.

Since the voltage generating circuit 18 that generates the first voltage V1 and the second voltage V2 based on the supply voltage VCC is formed, the first and second voltages V1, V2 can be reliably generated.

Figure 6:
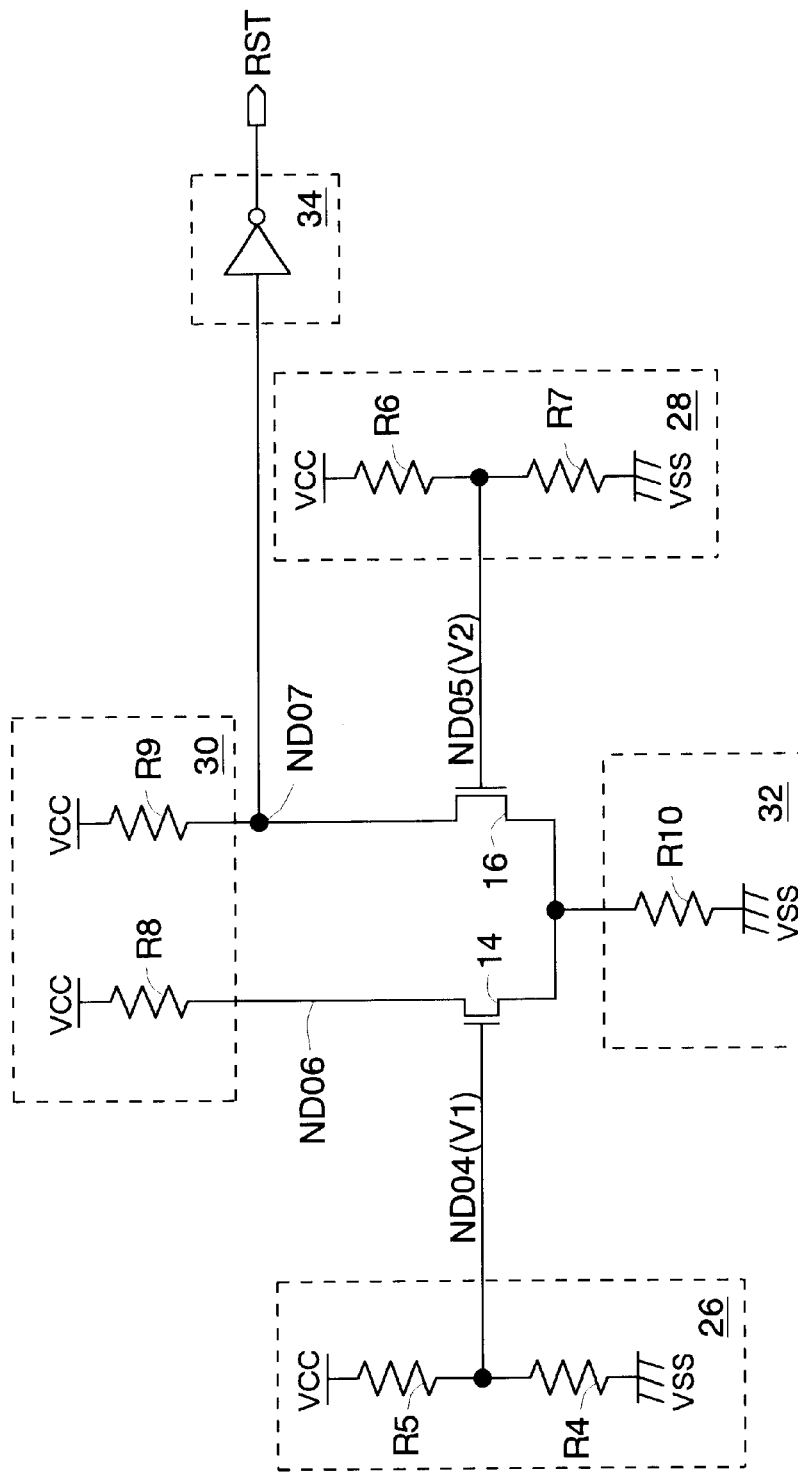
FIG. 6 is a circuit diagram showing a first embodiment of the present invention.

FIG. 6 shows a first embodiment of a resetting circuit and a semiconductor device having the resetting circuit of the present invention. The same reference characters as in the above-mentioned basic principle are given to constituent elements, respectively, in this embodiment that are identical to those in the above-mentioned basic principle, and a detailed description of them is omitted. As in the above-mentioned basic principle, the resetting circuit is formed in a SDRAM, and an internal circuit of the SDRAM is initialized in this embodiment.

The resetting circuit includes a first transistor 14, a second transistor 16, voltage generating circuits 26 and 28, a load circuit 30, an earth circuit 32, and a waveform shaping circuit 34 of an inverter. The voltage generating circuits 26 and 28, the load circuit 30, the earth circuit 32, and the waveform shaping circuit 34 of an inverter are a control circuit for generating a reset signal.

The ratio W/L of the gate width W to the channel length L of the second transistor 16 is 20 times as large as the ratio W/L of the gate width W to the channel length L of the first transistor 14. Especially, the channel length L of the second transistor 16 is equalized with that of the first transistor 14, and the gate width W of the second transistor 16 is designed to be 20 times as large as that of the first transistor 14. The source electrodes of the first and second transistors 14, 16 are connected to each other. These source electrodes are each connected to the earth circuit 32. The gate of the first transistor 14 is connected to the voltage generating circuit 26 through a node ND04 (first voltage V1). The, gate of the second transistor 16 is connected to the voltage generating circuit 28 through a node ND05 (second voltage V2). The drain electrodes of the first and second transistors 14, 16 are connected to 12) the load circuit 30 through nodes ND06 and ND07, respectively. The drain electrode (node ND07) of the second transistor 16 is connected to the waveform shaping circuit 34. The waveform shaping circuit-24 outputs a reset signal RST. The voltage generating circuit 26 is constructed such that resistors R4 and R5 are connected in series with each other with the node ND04 (first voltage V1) between a power supply line VCC and a ground line VSS. The voltage generating circuit 28 is constructed such that resistors R6 and R7 are connected in series with each other with the node ND05 (second voltage V2) between a power supply line VCC and a ground line VSS. The load circuit 30 is formed of resistors R8 and R9 each end of which is connected to a power supply line VCC, and the other ends are connected to the node ND06 and the node ND07, respectively. The earth circuit 32 is constructed by a resistor R10 an end of which is connected to a ground line VSS, and the other end is connected to the source electrodes of the first and second transistors 14, 16. The resistors R4 to R10 are formed by the use of diffusion layers (diffusion resistances).

In the resetting circuit of this embodiment, the voltage generating circuit 26 generates the first voltage V1 in accordance with the supply voltage VCC. The voltage generating circuit 28 generates the second voltage V2 which is lower than the first voltage V1 in accordance with the supply voltage VCC. When the drain-to-source current IDS of the first transistor 14 is equalized with the drain-to-source current IDS of the second transistor 16, the reset signal RST is inactivated, and the internal circuit of the SDRAM is released from an initialized state. The operation of the resetting circuit is the same as in FIG. 5.

The same effect as in the embodiment shown in FIG. 3 can be obtained in this embodiment.

Figure 7:
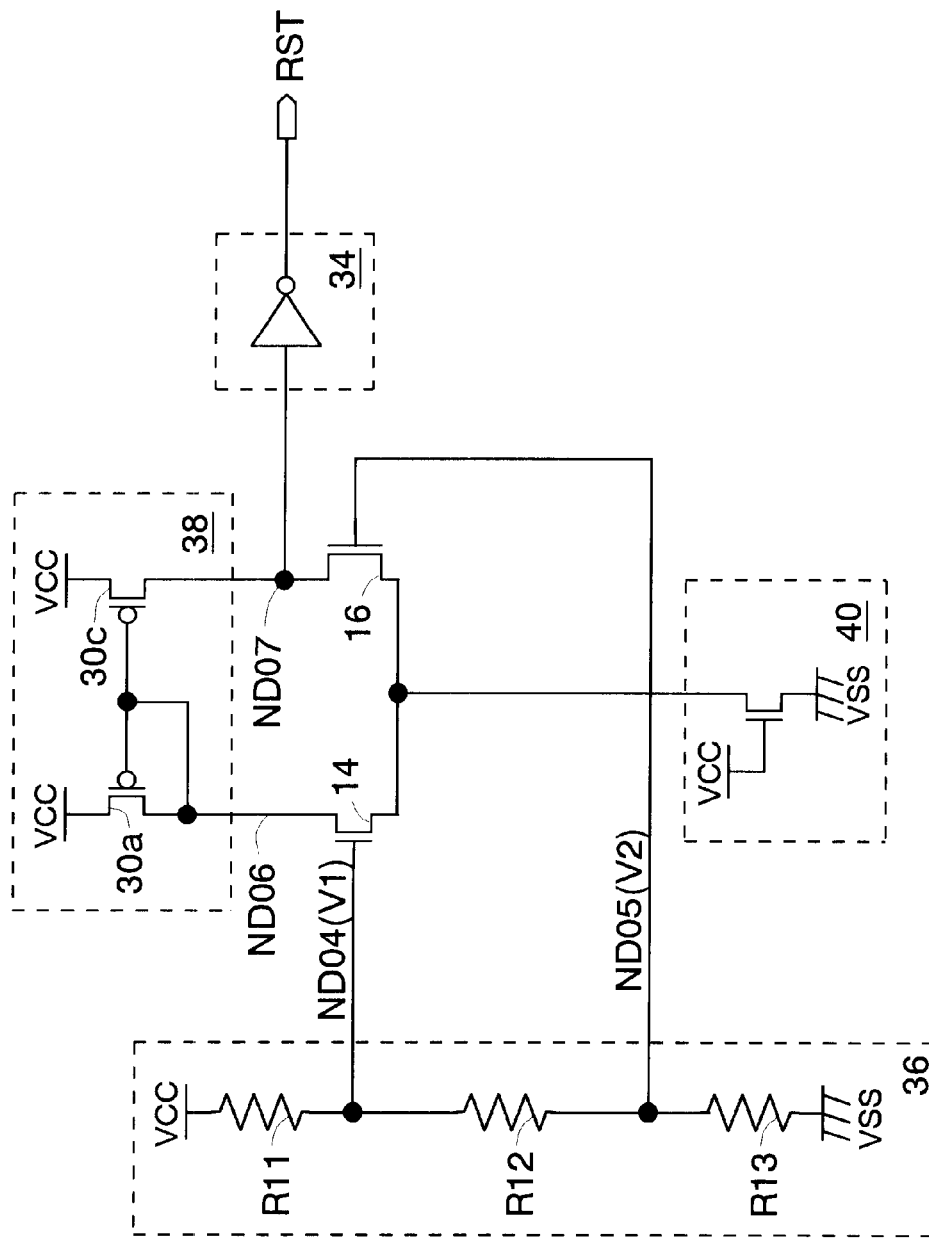
FIG. 7 is a circuit diagram showing a second embodiment of the present invention.

FIG. 7 shows a second embodiment of a resetting circuit and a semiconductor device having the resetting circuit of the present invention. The same reference characters as in the above-mentioned basic principle and the first embodiment are given to constituent elements, respectively, in this embodiment that are identical to those in the basic principle and the first embodiment, and a detailed description of them is omitted. The resetting circuit is formed in a SDRAM, and an internal circuit of the SDRAM is initialized in this embodiment in the same way as above.

The resetting circuit includes a first transistor 14, a second transistor 16, a voltage generating circuit 36, a load circuit 38, an earth circuit 40, and a waveform shaping circuit 34. The voltage generating circuit 36, the load circuit 38, the earth circuit 40, and the waveform shaping circuit 34 are a controlling circuit for generating a reset signal.

The ratio W/L of a gate width W to a channel length L of the second transistor 16 is 20 times as large as the ratio W/L of a gate width W to a channel length L of the first transistor 14. The source electrodes of the first and second transistors 14, 16 are connected to each other. The source electrodes are connected to the earth circuit 40. The gate of the first transistor 14 is connected to the voltage generating circuit 36 through a node ND04. The gate of the second transistor 16 is connected to the voltage generating circuit 36 through a node ND05. The drain electrodes of the first and second transistors 14,16 are connected to the load circuit 38 through nodes ND06 and ND07, respectively. The drain electrode (node ND07) of the second transistor 16 is connected to the waveform shaping circuit 34. The waveform shaping circuit 34 outputs a reset signal RST. The voltage generating circuit 36 is constructed such that resistors R11, R12, and R13 are connected in series with each other with nodes ND04 and ND05 between a power supply line VCC and a ground line VSS. The load circuit 38 has a current mirror. circuit that is formed of two pMOS transistors. In the pMOS transistor, its source electrode is connected to a power supply line VCC, its gate electrode is connected to the node ND06, and its drain electrode is connected to the nodes ND06 and ND07. The earth circuit 40 is constructed by an nMOS transistor in which its gate electrode is connected to a power supply line VCC, its source electrode is connected to a ground line VSS, and its drain electrode is connected to the source electrodes of the first and second transistors 14, 16.

The same effect as in the above-mentioned first embodiment can be obtained in this embodiment. Furthermore, in this embodiment, since both the first voltage V1 and the second voltage V2 are generated by the single voltage generating circuit 36, the relationship between the first voltage V1 and the second voltage V2 can be more easily maintained than in the first embodiment. Furthermore, the layout area of the voltage generating circuit can be reduced. Furthermore, since the load circuit 38 is constructed with the current mirror circuit, the ability of the reset signal RST to follow a change in the first and second voltages V1, V2 can be more greatly improved compared with the first embodiment. Furthermore, since the earth circuit 40 is constructed with the nMOS transistor, the layout area can be made smaller than in the first embodiment, compared with a case where the earth circuit is constructed with a diffusion resistance.

Figure 8:
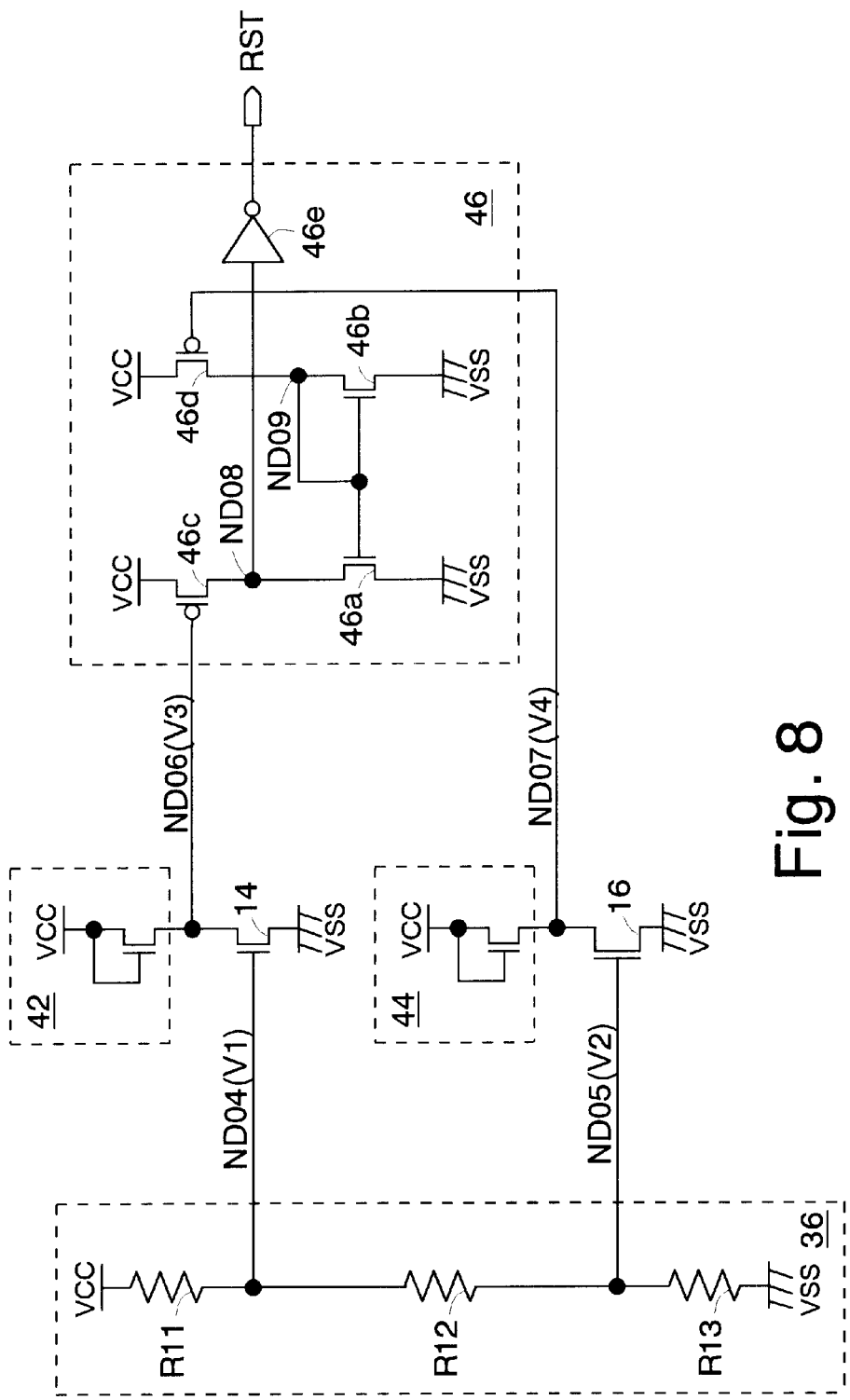
FIG. 8 is a circuit diagram showing a third embodiment of the present invention.

FIG. 8 shows a third embodiment of a resetting circuit and a semiconductor device having the resetting circuit of the present invention. The same reference characters as in the above-mentioned embodiments are given to constituent elements, respectively, in this embodiment that are identical to those in the above-mentioned embodiments, and a detailed description of them is omitted. The resetting circuit is formed in a SDRAM, and an internal circuit of the SDRAM is initialized in this embodiment in the same way as above.

The resetting circuit includes a first transistor 14, a second transistor 16, a voltage generating circuit 36, load circuits 42 and 44, and a waveform shaping circuit 46. The voltage generating circuit 36, load circuits 42 and 44, and the waveform shaping circuit 46 are a controlling circuit for generating a reset signal.

The ratio W/L of a gate width W to a channel length L of the second transistor 16 is 20 times as large as the ratio W/L of a gate width W to a channel length L of the first transistor 14. In the first and second transistors 14, 16, their source electrodes are connected to a ground line VSS. The gate of the first transistor 14 is connected to the voltage generating circuit 36 through a node ND04 (first voltage V1). The gate of the second transistor 16 is connected to the voltage generating circuit 36 through a node ND05 (second voltage V2). The drain electrodes of the first and second transistors 14, 16 are connected to the load circuits 42, 44 through nodes ND06 (voltage V3) and ND07 (voltage V4), respectively. The drain electrodes (nodes ND06 and ND07) of the first and second transistors 14, 16 are connected to the waveform shaping circuit 46. The waveform shaping circuit 46 outputs a reset signal RST. The load circuits 42, 44 are each constructed with a diode-connected nMOS transistor. That is, the gate electrode and the drain electrode of the nMOS transistor of each of the load circuits 42, 44 are connected to a power supply line VCC, and the source electrodes thereof are connected to the nodes ND06 and ND07, respectively.

The waveform shaping circuit 46 includes a current mirror circuit and an inverter 46e. The current mirror circuit is made of nMOS transistors 46a, 46b and pMOS transistors 46c, 46d. The inverter 46e outputs a reset signal RST. In the nMOS transistor 46a, its source electrode is connected to a ground line VSS, its gate electrode is connected to a node ND09, and its drain electrode is connected to a node ND08. In the nMOS transistor 46b, its source electrode is connected to a ground line VSS, and its gate electrode and drain electrode are connected to the node ND09. In the pMOS transistor 46c, its source electrode is connected to a power supply line VCC, its gate electrode is connected to the n ode ND06, and its drain electrode is connected to the node ND08. In the pMOS transistor 46d, its source electrode is connected to a power supply line VCC, its gate electrode is connected to the node ND07, and its drain electrode is connected to the node ND09. In the inverter 46e, its input is connected to the node ND08.

Figure 9:
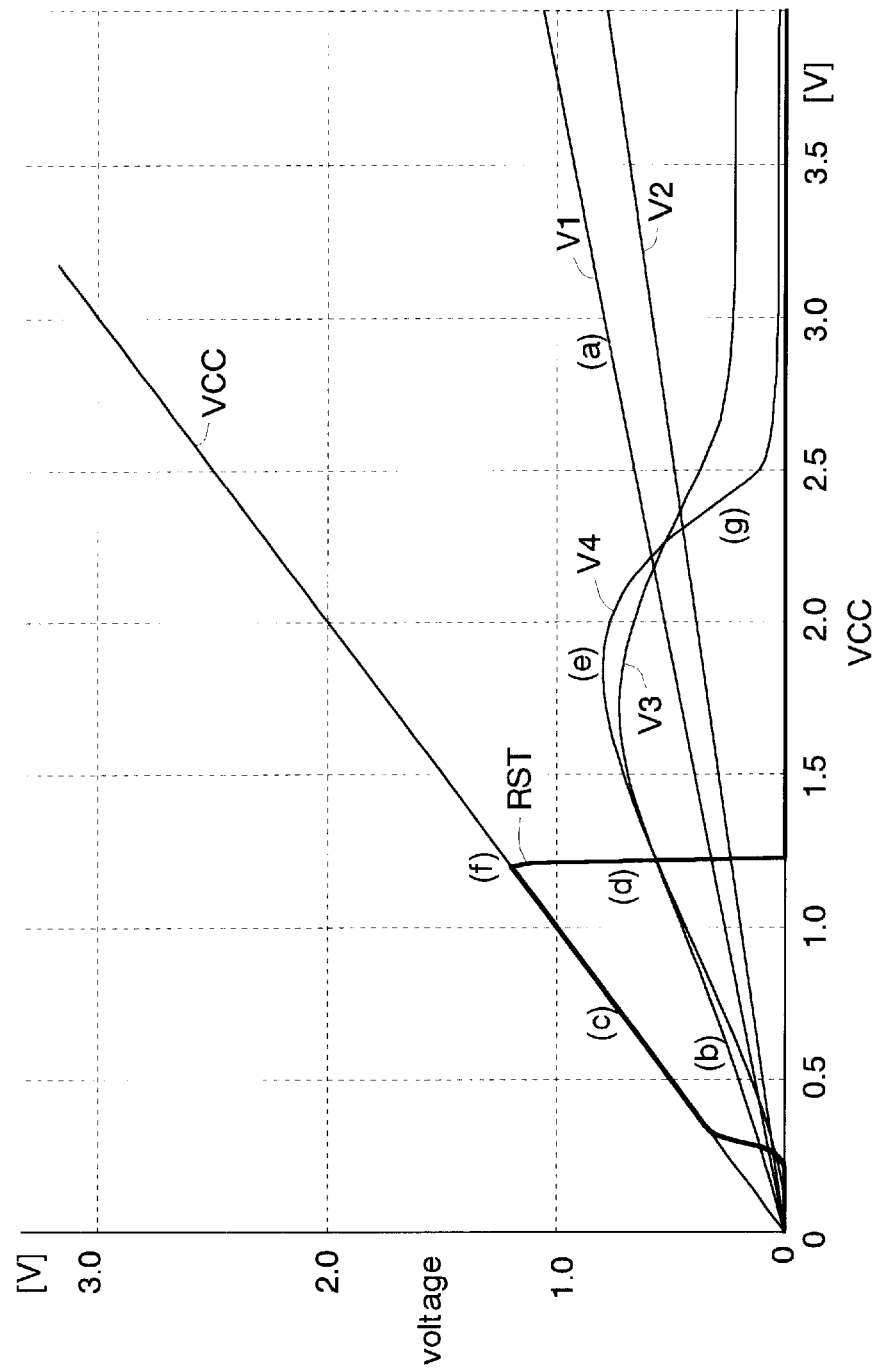
FIG. 9 is a characteristic diagram showing the operation of a resetting circuit of FIG. 8.

FIG. 9 shows the operation of the resetting circuit in FIG. 8.

When the power supply of the system mounted with the SDRAM is turned on, and the supply voltage VCC rises, the first voltage V1 and the second voltage V2 rise in accordance with the voltage VCC (FIG. 9(a)). In the voltages V3 and V4 of the nodes ND06 and ND07 shown in FIG. 8, the voltage V4 becomes low in the subthreshold area since the electric current IDS2 of the transistor 16 is large as shown in FIG. 4 (FIG. 9(b)). The waveform shaping circuit 46 shown in FIG. 8 receives the voltage V3 and the voltage V4 which is lower than the voltage V3 in the current mirror circuit, and outputs a high-level reset signal RST (FIG. 9(c)).

With the rise of the supply voltage VCC, the voltages V3 and V4 are equalized with each other (FIG. 9(d)). Thereafter, the voltage V3 becomes lower than the voltage V4 due to the fact that the current IDS1 of the transistor 14 shown in FIG. 4 exceeds the current IDS2 of the transistor 16 (FIG. 9(e)). The waveform shaping circuit 46 receives the voltage V3 and the voltage V4 which is higher than the voltage V3 in the current mirror circuit, and lowers the level of the reset signal RST (FIG. 9(f)).

When the supply voltage VCC further rises, and the first and second voltages V1, V2 rise, the on-resistances of the transistors 14, 16 decrease, and the voltages V3, V4 fall. Since the on-resistance of the transistor 16 that is larger in size than the transistor 14 becomes lower than that of the transistor 14 at this time, the voltage V4 of the node ND07 connected to the transistor 16 again becomes lower than the voltage V3 ((g) of FIG. 9). However, the current mirror circuit of the waveform shaping circuit 46 is situated out of the operating range of differential amplification when the supply voltage exceeds about 2V, and both the pMOS transistors 46c, 46d are turned on. For this reason, the reset signal RST never again changes to the high level.

The same effect as in the above-mentioned second embodiment can be obtained in this embodiment. Additionally, since the voltages V3, V4 generated in the drain electrodes of the transistors 14, 16 are given to the current mirror circuit of the waveform shaping circuit 46 in this embodiment, the ability of the reset signal RST to follow a change in the first and second voltages V1, V2 can be improved even more than in the second embodiment.

Figure 10:
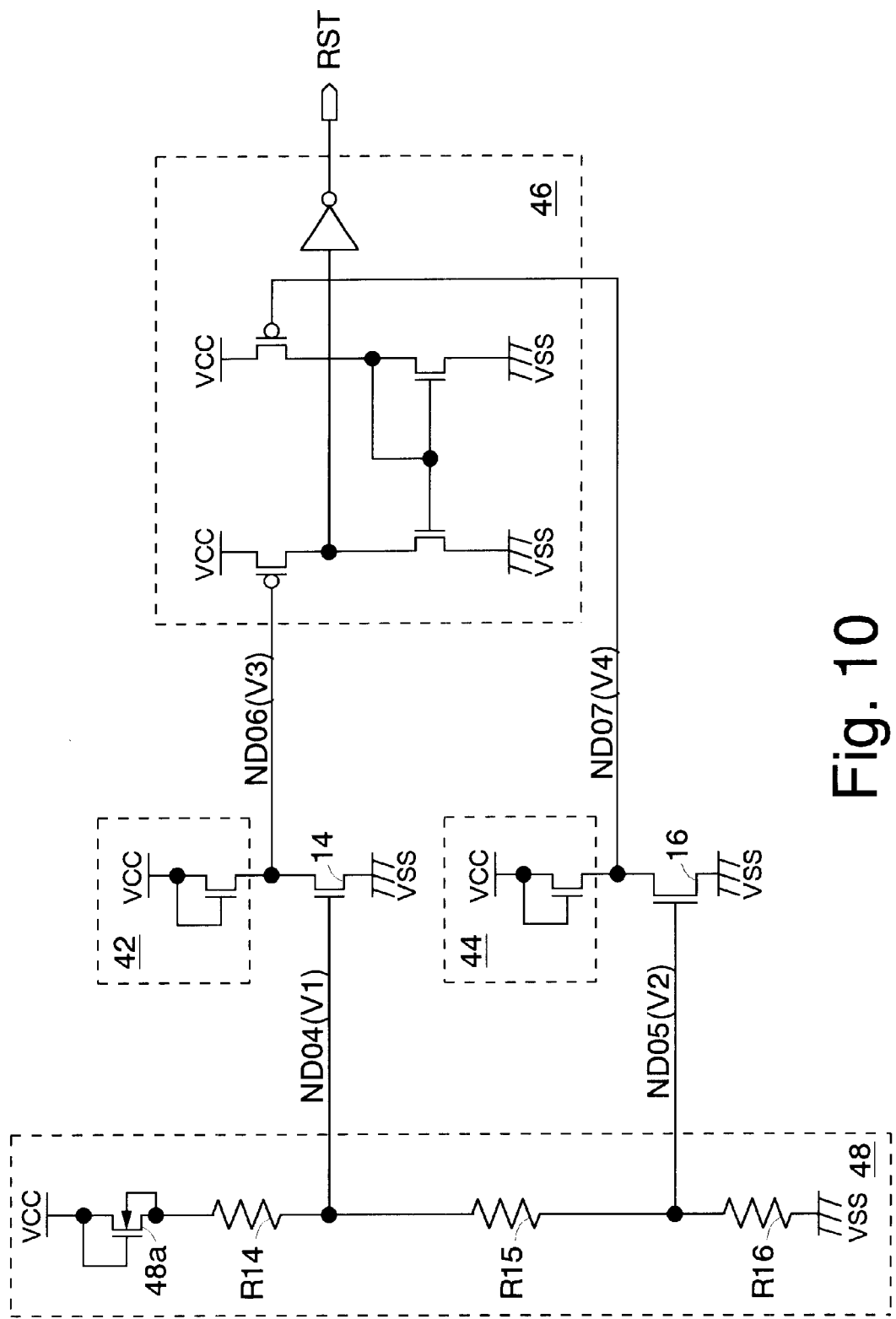
FIG. 10 is a circuit diagram showing a fourth embodiment of the present invention.

FIG. 10 shows a fourth embodiment of a resetting circuit and a semiconductor device having the resetting circuit of the present invention. The same reference characters as in the above-mentioned embodiments are given to constituent elements, respectively, in this embodiment that are identical to those in the above-mentioned embodiments, and a detailed description of them is omitted. In this embodiment, a voltage generating circuit 48 is used instead of the voltage generating circuit 36 described in the third embodiment. The other structures are substantially the same as in the third embodiment.

The voltage generating circuit 48 is formed of a diode-connected nMOS transistor 48a and resistors R14, R15, and R16 that are connected in series between a power supply line VCC and a ground line VSS. The gate electrode and the drain electrode of the hMOS transistor 48a are connected to the power supply line VCC, and the source electrode and the substrate thereof are connected to an end of the resistor R14. The connection node of the resistors R14, R15 is connected to the node NDO4. The connection node of the resistors R15, R16 is connected to the node ND05.

The same effect as in the above-mentioned third embodiment can be obtained in this embodiment. Additionally, in this embodiment, the gradient of the I-V characteristic shown in FIG. 4 can be sharpened in the vicinity of the intersection of the current IDS1 of the first transistor 14 and the current IDS2 of the second transistor 16 shown in FIG. 5. As a result, the ability of the reset signal RST to follow a change in the first and second voltages V1, V2 can be improved even more.

An example in which the resetting circuit is formed by the use of the nMOS transistors 14, 16 was described in the above-mentioned embodiments. However, the present invention is not limited to this example. For example, the resetting circuit may be formed by the use of two pMOS transistors.

An example in which the present invention is applied to a SDRAM was described in the above embodiments. However, the invention is not limited to this example. For example, the present invention may be applied to a FCRAM (Fast Cycle RAM). Alternatively, the present invention may be applied to a microcomputer, a logic LSI, and a system LSI.

This invention as a whole is also not limited to the above embodiments and various modifications may be made without departing from the spirit and scope of the invention. Any improvement may be made in part or all of the components.

What is claimed is:

1. A resetting circuit comprising:
    a first transistor for receiving at a gate electrode a first voltage rising in accordance with a rise in a supply voltage;
    a second transistor having a ratio W/L of a gate width W to a channel length L larger than a ratio W/L of said first transistor, for receiving at a gate electrode a second voltage rising in accordance with said rise in said supply voltage, the second voltage being lower than said first voltage; and
    a control circuit for generating a reset signal when drain-to-source currents of said first and second transistors are equalized with each other at a predetermined supply voltage.

2. The resetting circuit according to claim 1, wherein the channel length L of said first transistor is equal to the channel length L of said second transistor.

3. The resetting circuit according to claim 1, wherein said control circuit:
    comprises a load circuit connected to drain electrodes of said first and second transistors, for supplying respective electric currents said first and second transistors; and
    generates said reset signal in accordance with a change in voltages of the drain electrodes of at least one of said first and second transistors.

4. The resetting circuit according to claim 3, wherein said control circuit comprises a waveform shaping circuit for shaping a waveform of said reset signal.

5. The resetting circuit according to claim 1, wherein said control circuit comprises an earth circuit connected to source electrodes of said first and second transistors, for adjusting said electric currents running through said first and second transistors.

6. The resetting circuit according to claim 1, wherein said control circuit comprises a voltage generating circuit for generating the first and second voltages in accordance to said supply voltage.

7. A semiconductor device having a resetting circuit for initializing an internal circuit, said resetting circuit comprising:
    a first transistor for receiving at a gate electrode a first voltage rising in accordance with a rise in a supply voltage;
    a second transistor having a ratio W/L of a gate width W to a channel length L larger than a ratio W/L of said first transistor, for receiving at a gate electrode a second voltage rising in accordance said rise in said supply voltage, the second voltage being lower than said first voltage; and
    a control circuit for generating a reset signal when drain-to-source currents of said first and second transistors are equalized with each other at a predetermined supply voltage.

* * * * *